United States Patent
Makino et al.

(10) Patent No.: US 6,220,204 B1
(45) Date of Patent: Apr. 24, 2001

(54) FILM DEPOSITION METHOD FOR FORMING COPPER FILM

(75) Inventors: Hiroyuki Makino, Hiratsuka; Masaru Tanaka, Niihama; Kiyoshi Awai, Hiratsuka; Toshiyuki Sakemi, Niihama, all of (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 0 days.

(21) Appl. No.: 09/328,414

(22) Filed: Jun. 9, 1999

(30) Foreign Application Priority Data

Jun. 9, 1998 (JP) .................................................. 10-160325
Jun. 30, 1998 (JP) .................................................. 10-184116

(51) Int. Cl.7 ............................. C23C 14/32; C23C 16/06
(52) U.S. Cl. ............................... 118/723 R; 118/723 CB; 118/723 MP; 118/723 FI; 118/723 FE; 118/723 EB; 118/726; 204/192.17; 204/192.15; 204/192.3; 204/192.13; 204/192.12; 204/298.34; 204/298.06
(58) Field of Search ........................... 118/726, 723 EB, 118/723 FE, 723 MP, 723 CB, 723 FI, 723 R; 204/192.12, 298.34, 298.06, 192.17, 192.3, 192.15, 192.13

(56) References Cited

U.S. PATENT DOCUMENTS

| 4,885,070 | * | 12/1989 | Campbell et al. | ............... 204/298.06 |
| 4,999,096 | * | 3/1991 | Nihei et al. | ..................... 204/298.34 |
| 5,677,012 | * | 10/1997 | Sakemi et al. | .................... 118/723 R |

FOREIGN PATENT DOCUMENTS 8-232060   9/1996   (JP).

* cited by examiner

Primary Examiner—Mark F. Huff
Assistant Examiner—Daborah Chacko-Davis
(74) Attorney, Agent, or Firm—Arent Fox Kintner Plotkin & Kahn, PLLC (57) ABSTRACT

A film deposition apparatus to which the present invention is applied comprises a vacuum chamber 11, a plasma beam generator 13, a main hearth 30 which is disposed within the vacuum chamber and which serves as an anode containing a vaporizable material Cu, and an auxiliary anode 31 surrounding the main hearth, the auxiliary anode being formed of an annular permanent magnet 35 and a coil 36. A Cu film is formed on a substrate 41 placed opposite to the main hearth.

31 Claims, 6 Drawing Sheets

FILM DEPOSITION METHOD FOR FORMING COPPER FILM

BACKGROUND OF THE INVENTION

The present invention relates to a film deposition method to form a copper (Cu) film on a substrate. In particular, the present invention is suitable for forming a Cu wiring film in a groove or a hole formed in a substrate, in which the groove or the hole having a relatively high aspect ratio.

VLSI have been integrated highly in recent years. This means that a wiring width of an integrated circuit becomes narrow. In connection with this, the requirements for the copper film deposition to provide wiring have changed.

Various methods are developed as the wiring technique with Cu, examples of which include: long throw sputtering, wet plating, ionized metal plasma (IMP) deposition, chemical vapor deposition (CVD). Each method is explained briefly for the case where a film is formed in the hole with a bottom.

The long throw sputtering is a deposition technique which takes a large target-substrate (T-S) distance for the sputtering. In other sputtering techniques, it is typically desirable to shorten the T-S distance as much as possible, thereby to broaden a distribution of a film thickness as well as to increase a deposition speed. However, this does not apply to the long throw sputtering for some reasons. The sputtering technique uses a carrier gas to release sputtered substances for deposition, so that the sputtered substances fly slant upward rather than perpendicular to the target. With a short T-S distance, the slant movement of the substances results in by far faster rate of deposition around the entrance to the hole than at the bottom and the entrance to the hole is clogged before the completion of the deposition on the bottom. In order to solve this problem, it is necessary to provide a good bottom coverage by using a technique performed with a large T-S distance to form a uniform film at a low speed. The reason why the long throw sputtering takes the large T-S distance lies in the above. Thus the long throw sputtering is disadvantageous in the low rate of deposition.

The wet plating is a technique to deposit a film by using an electrolysis in a liquid vessel. This method is more cost-effective in equipment as compared with a vacuum deposition apparatus and provides a high deposition process (400 nm/min or faster). However, the wet plating is inherently troublesome because it is performed in the atmosphere, comparative to other processes performed in vacuum. The wet plating also has problems of higher possibilities of contamination by foreign materials and voids in the resultant film. The film has only lower adhesion to $SiO_2$ or a barrier metal (such as TiN and TaN). Furthermore, there exist the problem of complicated management of a layer as well as environmental problems in waste-fluid processing.

The IMP deposition is a technique in which a radio frequency is superposed on plasma in the deposition chamber for the sputtering to accelerate ionization of the flying substances. Ionized particles are withdrawn by using the electric field generated by a bias power source. This method is directed to improve the bottom coverage. The IMP deposition has attracted attentions as an approach that can achieve fast deposition with a shorter T-S distance as compared with the long throw sputtering.

For the CVD technique, Cu (tms) is dominant for now. However, to use Cu (tms) requires the substrate heated to a high temperature (at least 600° C.). This is the temperature with a possibility of destroying components on the substrate. Such a high temperature may cause a problem if an organic material is used for a stopper (capacitor) in the future as a measure against delay in the manufacture of LSIs. Furthermore, the gases used for the process is detrimental to the human body. The cost for processing these gases and management therefor pose a problem.

SUMMARY OF THE INVENTION

Therefore, an object of the present invention is to provide a deposition method for forming a copper film in a groove. or a hole which has a high aspect ratio at a higher speed as compared with conventional methods.

Another object of the present invention is to provide a method for depositing a copper film, by means of only a dry process, in a groove or a hole which has a high aspect ratio without generation of any void.

A deposition method for forming a film according to the present invention is applied to a film deposition apparatus comprising a vacuum chamber in which a deposition room is formed, a plasma source attached to the vacuum chamber, an anode disposed in the vacuum chamber to hold vaporizable copper, and a magnetic field generating mechanism having an annular permanent magnet provided about the anode and an electromagnetic coil. A substrate having a groove or a hole to be treated is placed in opposite to the anode for the formation of a copper film.

According to a preferred aspect of the present invention, a film of a vaporizable copper is formed in the groove or the hole in the substrate. In this case, the deposition apparatus further comprises a bias power source of which negative electrode is connected to the substrate. In particular, the voltage across the bias power source is varied during a single cycle of film deposition.

DETAILED DESCRIPTION OF THE PREFERRED EMBODIMENTS

Figure 1:
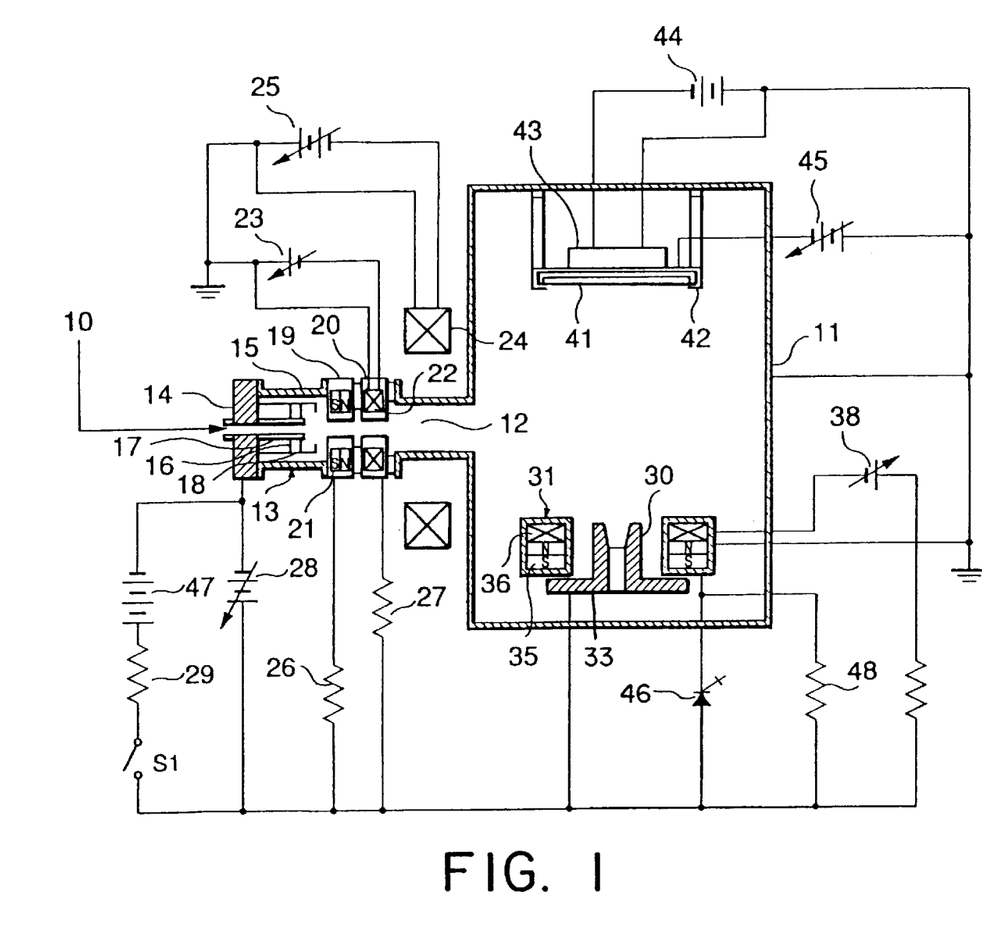
FIG. 1 is a cross-sectional view illustrating schematically a configuration of a film deposition apparatus to which the present invention is applied.

Referring to FIG. 1, a film deposition apparatus is described which is suitable for the implementation of a method for depositing a copper film according to the present invention. In FIG. 1, the film deposition apparatus comprises a vacuum chamber 11. A cylindrical member 12 is provided on one side wall of the vacuum chamber 11. A pressure gradient plasma beam generator 13 is attached to the cylindrical member 12. The plasma beam generator 13 comprises a cathode 14 and a glass tube 15 having one end closed with the cathode 14. In the glass tube 15, a cylinder 18 made of molybdenum (Mo) is fixed to the cathode 14. The cylinder 18 contains a disk 16 made of $LaB_6$ and a pipe 17 made of tantalum (Ta). The pipe 17 is for introducing a carrier gas 10 into the plasma beam generator 13.

First and second intermediate electrodes 19 and 20 are concentrically arranged between the end of the glass tube 15 opposite to the cathode 14 and the cylindrical member 12. The intermediate electrode (first grid) 19 includes an annular permanent magnet 21 for converging the plasma beam. The second intermediate electrode 20 (second grid) includes an electromagnetic coil 22 for converging the plasma beam. The electromagnetic coil 22 is energized by a power source 23.

A steering coil 24 for guiding the plasma beam into the vacuum chamber 11 is provided around the cylindrical member 12 to which the plasma beam generator 13 is attached. The steering coil 24 is excited by a steering coil power source 25. A main power source 28 of a variable voltage type is connected between the cathode 14 and the first and the second intermediate electrodes 19 and 20 through drooping resistors 26 and 27, respectively.

A main hearth 30 is disposed in the vacuum chamber 11 at the bottom thereof. An annular auxiliary anode 31 surrounds the main hearth 30. The main hearth 30 comprises a cylindrical hearth body 33 having a through hole. The hearth body 33 includes a depression formed in the top surface thereof for receiving the plasma beam from the plasma beam generator 13. The through hole in the hearth body 33 holds a vaporizable material (not shown). The auxiliary anode 31 comprises an annular case. The annular case houses an annular permanent magnet 35 made of, for example, ferrite and a coil 36 concentrically stacked on the permanent magnet 35. The main hearth 30 and the auxiliary anode 31 are both made of an electroconductive material having a high heat conductivity such as copper. The auxiliary anode 31 is attached to the main hearth 30 through an insulator. The main hearth 30 is connected to the auxiliary anode 31 through a resistor 48. The main hearth 30 is also connected to a positive side of the main power source 28. With the above-mentioned configuration, the main hearth 30 serves as an anode for the plasma beam generator 13 and attracts the plasma beam generated by the plasma beam generator 13.

The coil 36 in the auxiliary anode 31 is energized by a coil power source 38 to form an electromagnet. In this case, the arrangement is made such that the central magnetic field generated by the excited coil 36 has an orientation coincident with that of another central magnetic field generated by the permanent magnet 35. The coil power source 38 is a variable power source which can vary the electric current supplied to the coil 36 by varying the voltage.

A substrate holder 42 is provided in the vacuum chamber 11 for holding a substrate 41 above the main hearth 30. A heater 43 is mounted on the substrate holder 42. The heater 43 is energized by a heater power source 44. The substrate holder 42 is supported by the vacuum chamber 11 with being electrically insulated therefrom. A bias power source 45 is connected between the vacuum chamber 11 and the substrate holder 42. Consequently, the substrate holder 42 is biased to a negative potential with respect to the vacuum chamber 11 connected to a zero potential. The auxiliary anode 31 is connected to a positive side of the main power source 28 through a hearth switch 46. A drooping resistor 29 and an auxiliary discharge power source 47 are connected in parallel to the main power source 28 through a switch S1.

In the film deposition apparatus described above, electric discharges are generated between the cathode 14 of the plasma beam generator 13 and the main hearth 30 located within the vacuum chamber 11. This produces the plasma beam (not shown). The magnetic field defined by the steering coil 24 and the permanent magnet 35 in the auxiliary anode 31 is responsible for guiding the plasma beam to the main hearth 30. In other words, the plasma beam reaches the main hearth 30 with the help of the magnetic field. The vaporizable material contained in the main hearth 30 is heated by the plasma beam and is then evaporated. The vaporized material is ionized by the plasma beam. The ionized particles are adhered onto the surface of the substrate 41 to which the negative voltage is applied. As a result, a coating film is formed on the substrate 41.

The film deposition apparatus described above itself is known from Japanese Patent Laid-open No. 8-232060 (232060/1996). In the disclosed film deposition apparatus, various considerations are made about aspects of the polarity of the permanent magnet 35 and the coil 36 forming the auxiliary anode 31 as well as about distributions of traveling particles after the vaporization.

A method for depositing a film according to a first embodiment of the present invention makes it possible to form a copper film with this film deposition apparatus. Features of the method are described in brief below.

A. A deposition pressure in the range of between $10^{-4}$ and $10^{-2}$ Torr in the vacuum chamber 11 during the deposition.

B. An electron temperature of 2 eV or higher during the deposition.

C. The maximum electron density of at least $10^{10}$ electrons/cm$^3$ in the vacuum chamber 11 during the deposition.

D. Introduction of an inert gas such as argon (Ar) or helium (He) or a hydrogen gas as the carrier gas 10 to keep the electric discharge in the plasma beam generator 13.

E. A discharge current of 10 A or larger during the deposition.

F. A voltage value of 30 V or higher during the deposition.

G. A distance of between 100 mm and 1,000 mm from the top surface of the permanent magnet 35 in the auxiliary anode 31 to the substrate 41.

The following results are obtained with the deposition method by using the arc discharge plasma under the above-mentioned conditions.

It is known that the deposition processes using the arc discharge plasma typically generate a high electron temperature Te (2–100 eV) and a high electron density Ne ($10^{10}$–$10^{13}$ electrons/cm$^3$). This means that it is possible to obtain a vaporizable material which can be highly ionized in the deposition space at or around the vacuum (approximately $10^{-4}$ to $10^{-2}$ Torr). To use the bias power source provides similar effects to those obtained by using the above-mentioned IMP deposition.

Unlike the sputtering, the orientation of the vaporized particles in this deposition method follows a cosine$^4$ rule or a cosine$^5$ rule. The deposition can be made rather linearly depending on the value for the T-S distance. Therefore, this method may be used for a deep groove or hole having a high aspect ratio. An advantage of the present deposition method is a constant rate of deposition both at the bottom and in the entrance of the groove or the hole with the application of no bias voltage. With a bias voltage applied, the rate of deposition is higher at the bottom than in the entrance.

Though not so high as the wet plating, the rate of deposition is approximately 20–30 Angstrom/s, which is higher than that obtained in other processes except for the wet plating.

The rate of deposition can be improved further by means of a simple modification which includes to change the dimension of the depression in the main hearth 30 containing copper as the vaporizable material. Unlike the CVD technique, the present process requires no poisonous gas and is thus favorable for the environment. In the sputtering, a material of high purity is used as a target (higher than 6 N) because the purity of the material used affects significantly a specific resistance of the resultant film. The material is in the form of an integrated mass of a pure metal which is quite large. The CVD technique requires a considerably high cost because of a special gas used.

On the contrary, the purity does not need to be so high in the deposition method according to the present invention because of a vacuum refinement stage included in the process. The experimental results obtained by the present indicate that the specific resistance of the film is 1.7 to 2.2 $\mu\Omega\cdot cm$ (4 N). This range is close to the maximum value for a thin film (having a film thickness of not smaller than 500 Angstrom). The material may be in any one of appropriate forms including powder and billet as long as it can be contained in the chamber. This feature significantly saves the cost of the copper material as compared with the above-mentioned two techniques.

Figure 2:
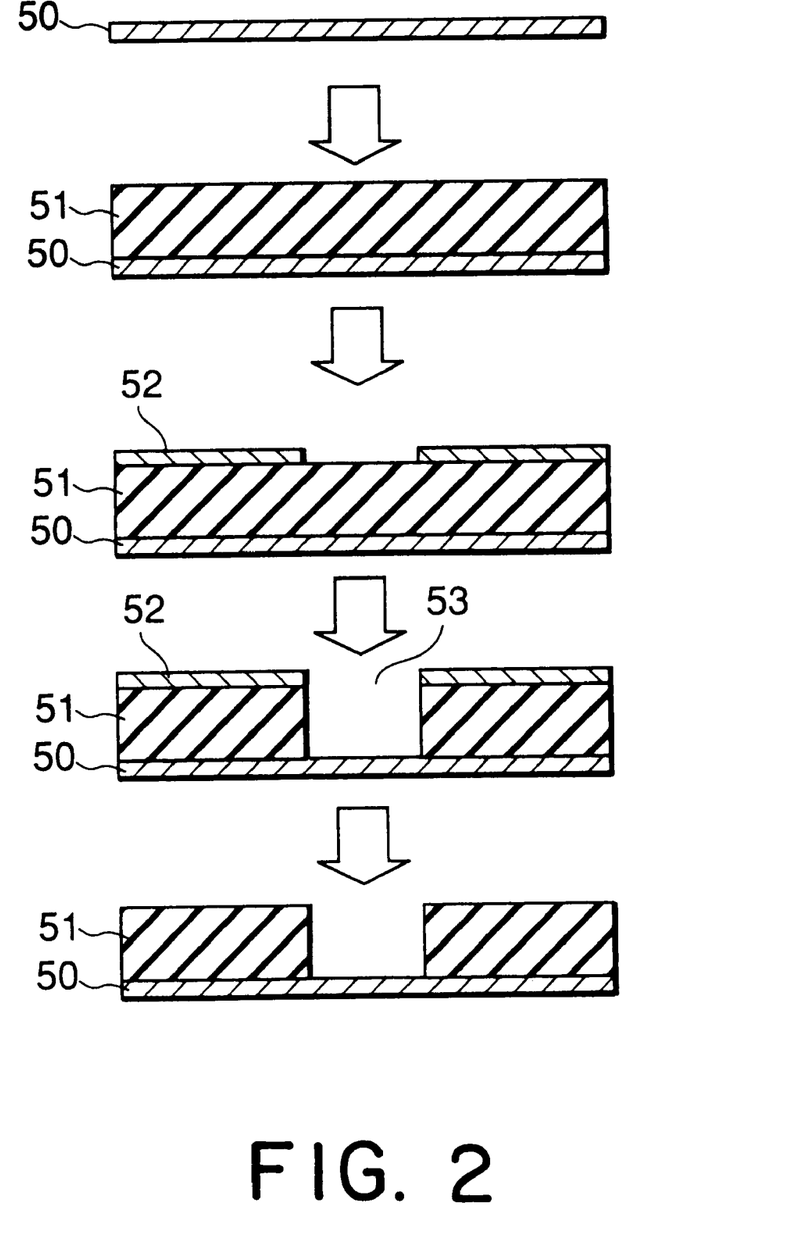
FIG. 2 is a schematic description of a process for manufacturing a semiconductor substrate which is subjected to the present invention.
Figure 3:
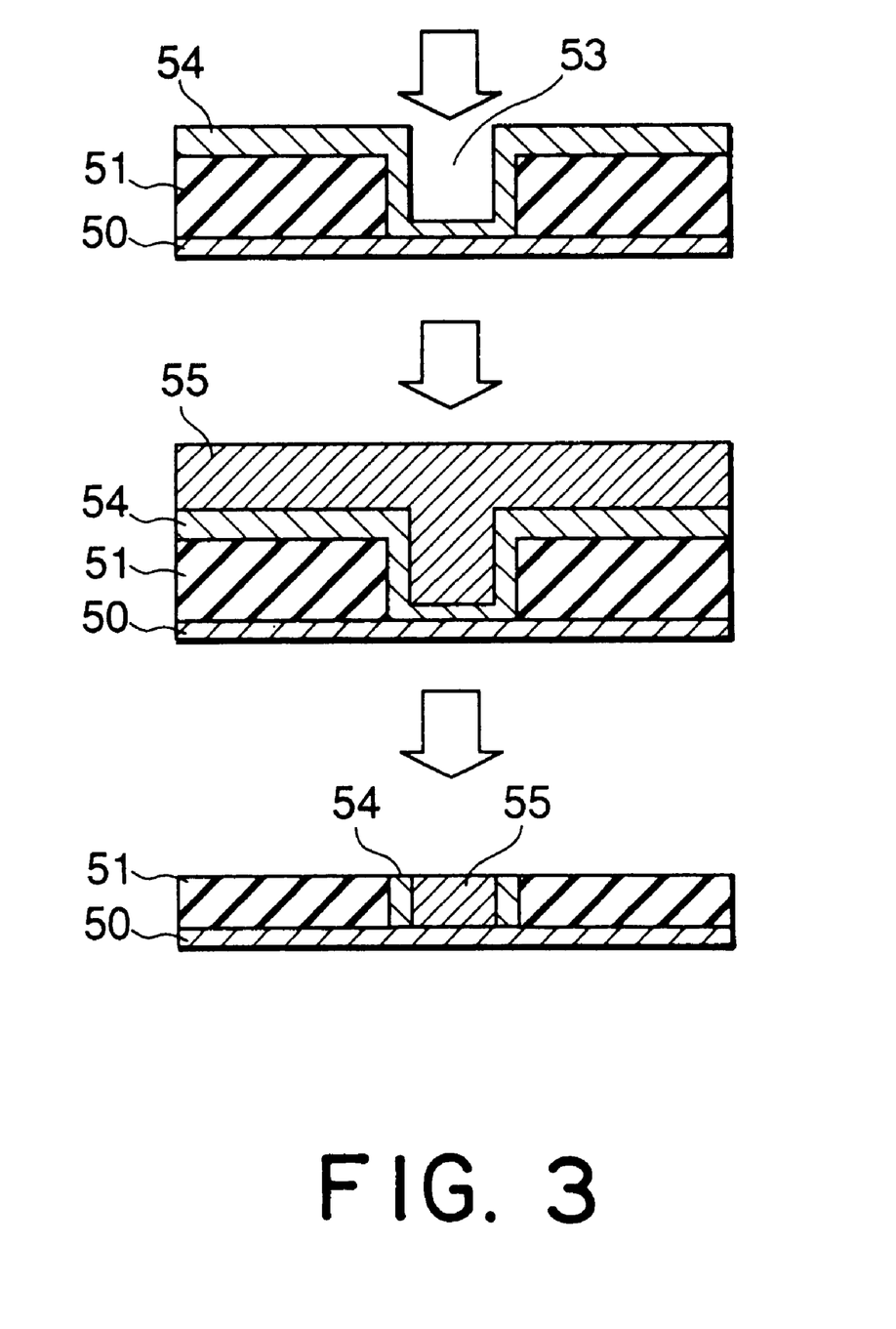
FIG. 3 is a schematic description of a process for producing a copper wiring according to a first embodiment of the present invention.

Referring to FIGS. 2 and 3, a second embodiment of the present invention is described. First, a semiconductor substrate which is subjected to the present invention is described. In FIG. 2, a silicon dioxide ($SiO_2$) film 51 is formed on a silicon substrate 50. Subsequently, a mask 52 is formed on the $SiO_2$ film 51 for the etching to form a groove or a hole (herein a groove is used as an example) 53 in the $SiO_2$ film 51 at a desired location. The mask 52 is then removed. It is noted that the $SiO_2$ film 51 is formed on the silicon substrate 50 as an interlayer insulating film. The latest trend has directed toward the use of an organic film of, for example, polyimide in place of the $SiO_2$ film 51 to reduce the dielectric constant (as a countermeasure against CR delay).

In FIG. 3, a barrier film 54 of titanium oxide (TiN) or tantalum oxide (TaN) is formed on the entire surface of the $SiO_2$ film 51 including the groove 53. The barrier film 54 is a thin film having a film thickness of 50–200 Angstrom. Next, a copper (Cu) film 55 is formed in the groove 53 covered with the barrier film 54 in the manner according to the present invention which is described in detail below. The groove 53 is filled with the Cu film 55 accordingly. Then, the barrier film 54 and the Cu film 55 on the $SiO_2$ film 51 are removed by means of a chemical mechanical polishing (CMP) treatment. Consequently, the wiring film formed of the Cu film 55 remains in the $SiO_2$ film 51 through the barrier film 54.

For the formation of the Cu film 55 in the groove 53 in the manner described above, the first embodiment continuously applies a bias voltage of a constant level from the beginning to the end of the deposition. It is understood that to apply the bias voltage causes sputtering at the same time of the deposition, allowing the formation of a flat film. However, this results in an effect of creating a hole in the region around the entrance of the groove 53. Continuous deposition with the application of a constant bias voltage can decrease the rate of deposition in the upper portion of the groove 53 and eventually generate a void therein.

This is described in detail below with reference to FIGS. 4 and 5.

Figure 4:
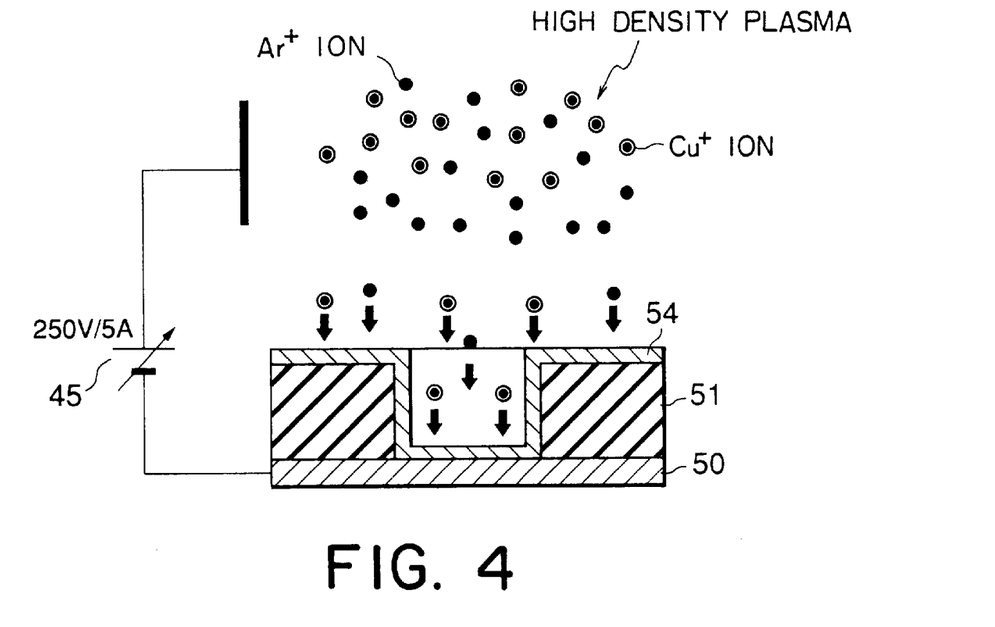
FIG. 4 is a view illustrating formation of a copper film according to a second embodiment of the present invention.

FIG. 4 is a diagrammatic representation of the process for depositing a film in the film deposition apparatus shown in FIG. 1. The source of a high density plasma is not limited to that of the arc discharge type as described in FIG. 1. Instead, the plasma source may be any one of appropriate devices capable of generating plasma such as those using a microwave, an RF discharge, or a helicon wave. The $Ar^+$ ions are herein used as the carrier gas, which may be other ions suitable for a specific application (if a reactive gas is introduced in). Alternatively, an inert gas may be used for this purpose. Examples of the reactive gas include $O_2$, $H_2$, $N_2$, $CH_4$ and silane gas. Examples of the inert gas include Ar, He, Xe, and Ne. $Cu^+$ ions are obtained as a result of the ionization of the Cu vapor with the plasma. The Cu may be vaporized by means of sputtering, ohmic-resistance heating or laser heating besides the arc discharge described in conjunction with FIG. 1. Alternatively, the copper may be vaporized at the time of introduction as in the CVD process.

The bias power source 45 may be any one of a DC (direct current) type, an RF type, or a pulse type. Though indicated to have 250 V/5A in FIG. 4, the bias power source depends on the apparatus and condition(s) used. These values are not significant for the purpose of the present invention. The negative side of the bias power source 45 is connected to the silicon substrate 50. The positive side of the bias power source 45 is connected to an appropriate power source subjected to plasma. The positive side is typically connected to the vacuum chamber 11 (FIG. 1), a ground, or an anode (in the case of EB) for the discharge.

Figure 5:
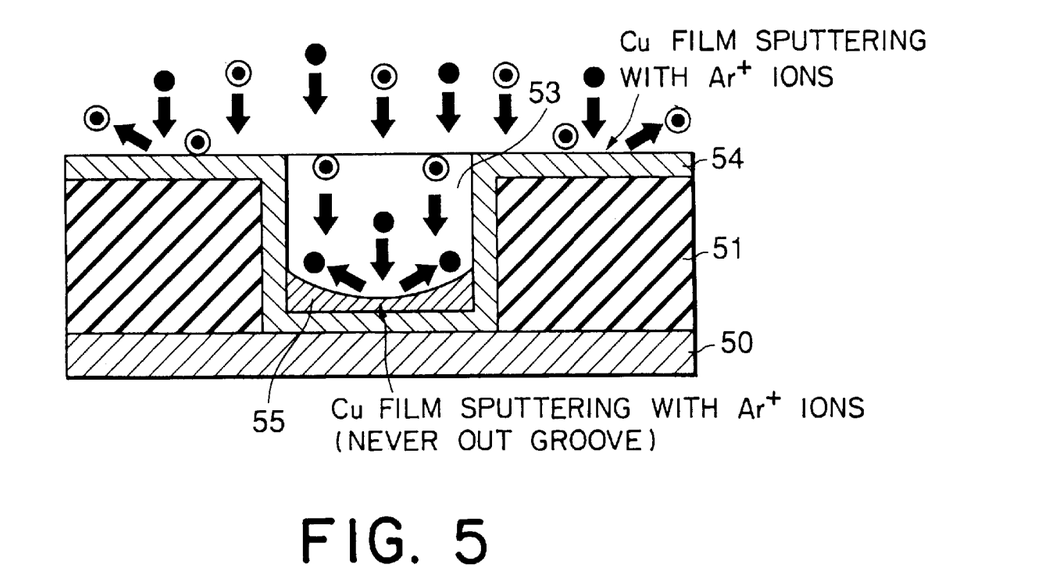
FIG. 5 is a view illustrating an effect of a bias voltage during the formation of a copper film according to the second embodiment of the present invention.

Referring to FIG. 5, an effect of the bias is described. The particles ionized by the plasma are attracted towards the silicon substrate 50 due to a clone force. The ions collide with the silicon substrate 50 and form a thin film as a result of losing their charges at the bottom of the groove 53 where an electrical current flows. The ions do not form a thin film on the top surface of the substrate where no electrical current flows. Neutral Cu particles which are not ionized form a film regardless of whether they are located at the bottom of the groove 53 or on the surface of the substrate.

With a higher bias voltage, the ion implantation energy increases to cause the rate of deposition at the bottom of the groove 53 to be higher than that on the surface of the substrate. If the groove 53 has a high aspect ratio, only the neutral particles flying linearly and the particles attracted by the electric field and flying linearly can reach the bottom of the groove 53. Other particles cannot reach that place. Nevertheless, the film formed at the bottom of the groove is also sputtered, so that the sputtered particles enter linearly (i.e., the aspect ratio is high) and are flipped in the lateral direction. Therefore, the sputtered particles cannot go out of the groove 53. They eventually form a film in the groove 53.

When the groove 53 is filled with the Cu film 55 to a certain extent, the laterally sputtered particles go out of the groove 53. The portion where the particles goes away is not filled. The failure of filling the groove 53 can result in a defect called "void". Furthermore, the sputtering decreases the rate of the deposition.

A second embodiment of the present invention is a method which solves the such a problem, of the void formation. More specifically, the second embodiment provides a process capable of filling the groove completely without formation of any void nor reduction of the rate of the deposition by means of varying the bias voltage from the beginning to the end of the film deposition. The conditions used during the deposition are those described above in A to G.

Referring to FIGS. 6A through 6E, an example of the bias voltage application according to the second embodiment is described.

(1) In a first step at the beginning of the deposition (FIG. 6A), the bias voltage is determined at a relatively low level because a higher bias voltage may damage the barrier film 54 and the silicon film 50. The bias voltage as a standard is at the level around a sputter threshold value for the material to be deposited. The sputter threshold value is a boundary where the material is sputtered or not and is typically not lower than 50 V for metals. It should be noted that no bias is applied when the deposition method used is the one of a good linearity (e.g., vacuum deposition and URT).

(2) When several layers are formed at the bottom of the groove 53 with a film thickness of 10 Angstrom or larger (FIG. 6B), the bias voltage is raised in the second step because there is no possibility of the silicon substrate 50 and the barrier film 54 being etched by the sputtering. Consequently, a large volume of ions can be attracted in the groove 53. This increases the rate of the deposition. On the other hand, the sputtering occurs more aggressively around the entrance of the groove 53, etching the film to reduce the rate of the deposition.

(3) When the groove 53 is filled to a certain extent with the Cu film 55 (FIG. 6C) such that the Cu particles can enter the groove 53 without the assistance of the bias voltage with the groove 53 having an aspect ratio of, for example, around 1, The bias voltage is again lowered or be disconnected in this third step. As a result, no more sputtering occurs around the entrance of the groove 53. The groove 53 can then be filled in a short time without the formation of any void.

Figure 6A:
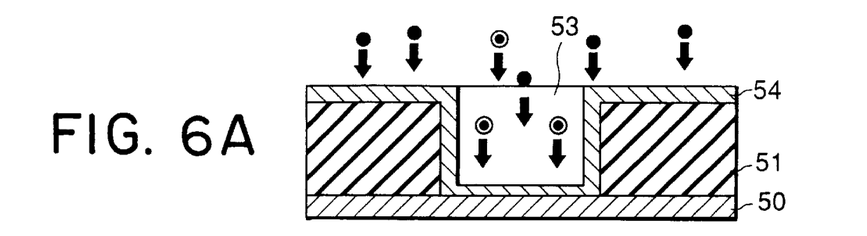
FIGS. 6A through 6E are illustrations for describing a manufacturing process of a copper film according to the second embodiment of the present invention.
Figure 6B:
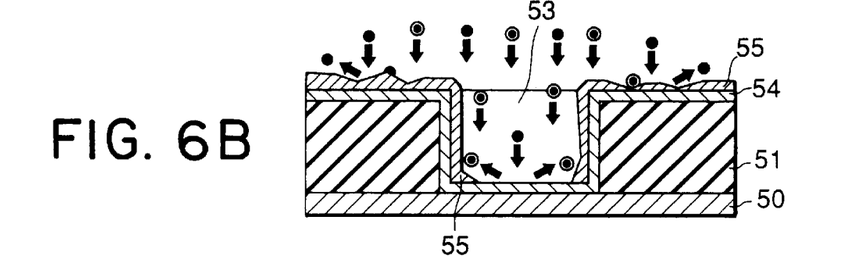
Figure 6C:
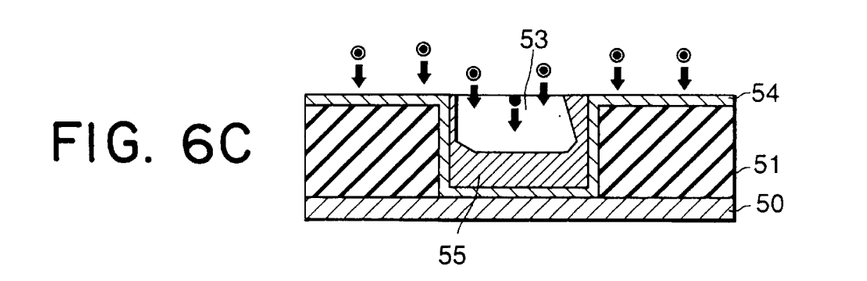
Figure 6D:
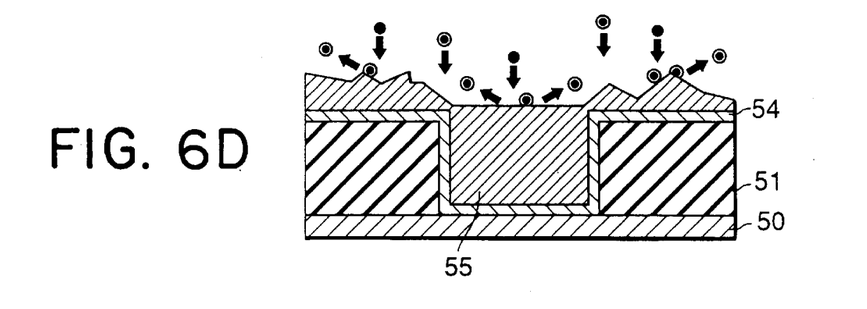
Figure 6E:
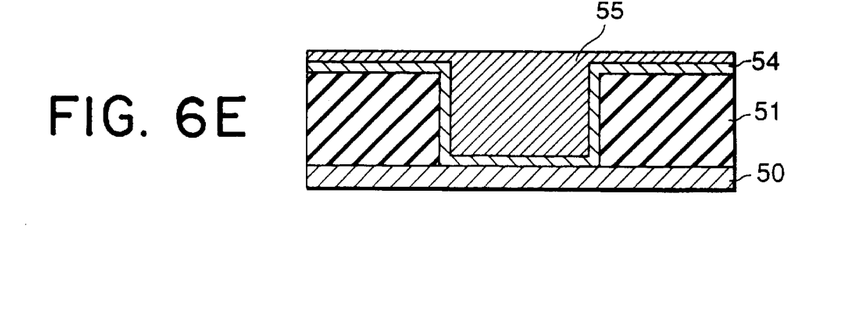

(4) The bias voltage is again raised at the time when the groove is completely filled and the Cu film 55 is higher than the groove 53 (FIG. 6D). The film formation is performed simultaneously with the etching to form the flat Cu film 55 (FIG. 6E) in a fourth step. In this way, an excessive growth (in the direction of thickness) of the Cu film 55 is restricted. This reduces the amount of the Cu film to be removed in the subsequent CMP treatment (see FIG. 3), reducing a total cycle time of the post-process.

Figure 7:
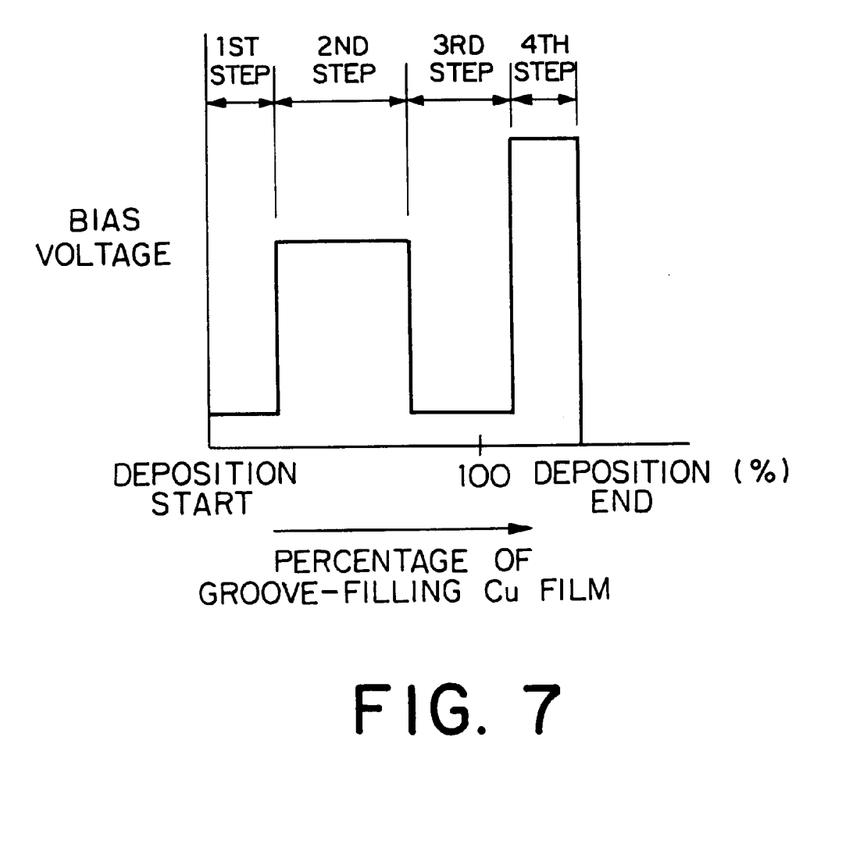
FIG. 7 is a view showing an example of variation pattern for a bias voltage during the formation of a copper film according to the second embodiment of the present invention.

FIG. 7 shows the change in bias voltage as a function of the percentage of the Cu film 55 filling the groove 53. A pattern of a bias voltage profile may be determined depending on the thickness of the Cu film 55. Alternatively, experiments may be made and thereafter the pattern of the bias voltage profile may be determined as a function of time.

As described above, according to the second embodiment of the present invention, it is possible to provide a process capable of filling the groove completely without formation of any void nor reduction of the rate of the deposition by means of varying the bias voltage from the beginning to the end of the film deposition.

With respect to the above, the method for depositing a Cu film according to the present invention is a novel approach of depositing copper which is of interest as a material for multi-layer wiring to be used in next generation semiconductor devices. This method is suitable for providing wiring of higher degree of fineness and lower resistance, accompanied by the densification of VLSIs. The method of the present invention can deposit a film at a high speed in a groove or a hole having a high aspect ratio. Of course, the deposition method of the present invention may be applied to a case where the Cu film is formed on the surface of the substrate rather than in the groove or the hole.

In the foregoing embodiments, description has been made about the case where the substrate is biased to a negative potential by the use of the bias power source of a DC type. However, the bias power source need not be restricted to the DC type but may be of an AC (alternate current) type. If the bias power source of an AC type is used, the phenomenon similar to that described in conjunction with FIGS. 6A through 6E occurs in every period during which the substrate has a negative potential. In this event, the AC output power is varied from the beginning to the end of the film deposition.

As described above, the method for depositing a Cu film by using the plasma according to the present invention can be used for the grooves and holes having a high aspect ratio. This is performed in a clean vacuum space at a high rate of deposition in a environment-favorable manner. In addition, a good Cu film can be formed while restricting the formation of any void by using a material of a low cost.

What is claimed is:

1. A method for depositing a copper film in a film deposition apparatus comprising a vacuum chamber;

a plasma source attached to the vacuum chamber;

an anode disposed in the vacuum chamber to hold vaporizable copper;

a magnetic field generating mechanism having an annular permanent magnet provided about the anode and an electromagnetic coil; and a bias power source of which a negative side is connected to a substrate to be treated, said method comprising depositing copper in a groove or hole in the substrate and simultaneously applying a voltage from said bias power source to the substrate, wherein the voltage from said bias power source is varied by the following steps when copper is deposited in the groove or hole:

(a) setting the voltage at zero level or at a value around a sputter threshold value for copper;

(b) raising the voltage when a plurality of layers of copper are deposited in the groove or the hole to form a copper film;

(c) lowering the voltage when the groove or hole is partially filled with the copper film such that copper particles can enter the groove or hole without the assistance of the voltage;

(d) raising again the voltage when the groove or hole is completely filled with the copper film and the film thickness exceeds the depth of the groove or the hole; and (e) maintaining the raised voltage until the completion of the deposition of the copper film;

wherein the deposition of the copper film is completed with conducting step (a) to step (c) only once.

2. A method as claimed in claim 1, wherein said vacuum chamber is set at a deposition pressure ranging from $10^{-4}$ to $10^{-2}$ Torr during the deposition of the copper film.

3. A method as claimed in claim 1, wherein an electron temperature during the deposition of the copper film is 2 eV or higher.

4. A method as claimed in claim 1, wherein said vacuum chamber has a maximum electron density of $10^{10}$ electrons/$cm^3$ or higher during the deposition of the copper film.

5. A method as claimed in claim 1, wherein a gas selected from the group consisting of an inert gas, $H_2$, $O_2$, $N_2$, $CH_4$ and silane gas is introduced as a gas to maintain the discharge in said plasma source.

6. A method as claimed in claim 1, wherein a discharge current of 10 A or larger flows during the deposition of the copper film.

7. A method as claimed in claim 1, wherein a discharge current is 10 A or larger and a voltage is 30 V or higher during the deposition of the copper film.

8. A method as claimed in claim 1, wherein a distance between the top surface of the permanent magnet in said magnetic field generating mechanism and said substrate is in a range of from 100 mm to 1,000 mm.

9. A method as claimed in claim 1, wherein said bias power source is a DC power source.

10. A method as claimed in claim 1, wherein said bias power source is an AC power source.

11. A method for depositing a copper film in a film deposition apparatus comprising a vacuum chamber;

a plasma source attached to the vacuum chamber;

an anode disposed in the vacuum chamber to hold vaporizable copper;

a magnetic field generating mechanism having an annular permanent magnet provided about the anode and an electromagnetic coil; and a bias power source of which a negative side is connected to a substrate to be treated, said method comprising depositing copper in a groove or hole in the substrate and simultaneously applying a voltage from said bias power source to the substrate, wherein the voltage from said bias power source is varied by the following steps when copper is deposited in the groove or hole:

(a) setting the voltage at zero level or at a value around a sputter threshold value for copper;

(b) raising the voltage when a plurality of layers of copper are deposited in the groove or the hole to form a copper film;

(c) lowering the voltage when the groove or hole is partially filled with the copper film such that copper particles can enter the groove or hole without the assistance of the voltage;

(d) raising again the voltage when the groove or hole is completely filled with the copper film and the film thickness exceeds the depth of the groove or the hole; and thereafter (e) maintaining the raised voltage until the completion of the deposition of the copper film;

wherein a thickness of the copper film at the bottom of the groove or hole continuously increases from step (a) to step (d); wherein the deposition of the copper film is completed with conducting step (a) to step (c) only once.

12. A method as claimed in claim 11, wherein said vacuum chamber is set at a deposition pressure ranging from $10^{-4}$ to $10^{-2}$ Torr during the deposition of the copper film.

13. A method as claimed in claim 11, wherein an electron temperature during the deposition of the copper film is 2 eV or higher.

14. A method as claimed in claim 11, wherein said vacuum chamber has a maximum electron density of $10^{10}$ electrons/cm$^3$ or higher during the deposition of the copper film.

15. A method as claimed in claim 11, wherein a gas selected from the group consisting of an inert gas, $H_2$, $O_2$, $N_2$, $CH_4$ and silane gas is introduced as a gas to maintain the discharge in said plasma source.

16. A method as claimed in claim 11, wherein a discharge current of 10 A or larger flows during the deposition of the copper film.

17. A method as claimed in claim 11, wherein a discharge current is 10 A or larger and a voltage is 30 V or higher during the deposition of the copper film.

18. A method as claimed in claim 11, wherein a distance between the top surface of the permanent magnet in said magnetic field generating mechanism and said substrate is in a range of from 100 mm to 1,000 mm.

19. A method as claimed in claim 11, wherein said bias power source is a DC power source.

20. A method as claimed in claim 11, wherein said bias power source is a AC power source.

21. A method for depositing a copper film in a film deposition apparatus comprising a vacuum chamber;

a plasma source attached to the vacuum chamber;

an anode disposed in the vacuum chamber to hold vaporizable copper;

a magnetic field generating mechanism having an annular permanent magnet provided about the anode and an electromagnetic coil; and a bias power source of which a negative side is connected to a substrate to be treated, said method comprising depositing copper in a groove or hole in the substrate and simultaneously applying a voltage from said bias power source to the substrate, wherein the voltage from said bias power source is varied during a single cycle of deposition of the copper films, wherein the voltage from said bias power source is varied by the following steps when copper is deposited in the groove or hole:

(a) setting the voltage at zero level or at a value around a sputter threshold value for copper;

(b) raising the voltage when a plurality of layers of copper are deposited in the groove or the hole to form a cooper film; and thereafter (c) lowering the voltage when the groove or hole is partially filled with the copper film such that copper particles can enter the groove or hole without the assistance of the voltage until the completion of the deposition of the copper film;

wherein the deposition of the copper film is completed with conducting step (a) to step (c) only once.

22. A method as claimed in claim 21, wherein a thickness of the copper film at the bottom of the groove or hole continuously increases from step (a) to step (c).

23. A method as claimed in claim 21, wherein said vacuum chamber is set at a deposition pressure ranging from $10^{-4}$ to $10^{-2}$ Torr during the deposition of the copper film.

24. A method as claimed in claim 21, wherein an electron temperature during the deposition of the copper film is 2 eV or higher.

25. A method as claimed in claim 21, wherein said vacuum chamber has a maximum electron density of $10^{10}$ electrons/cm$^3$ or higher during the deposition of the copper film.

26. A method as claimed in claim 21, wherein a gas selected from the group consisting of an inert gas, $H_2$, $O_2$, $N_2$, $CH_4$ and silane gas is introduced as a gas to maintain the discharge in said plasma source.

27. A method as claimed in claim 21, wherein a discharge current of 10 A or larger flows during the deposition of the copper film.

28. A method as claimed in claim 21, wherein a discharge current is 10 A or larger and a voltage is 30 V or higher during the deposition of the copper film.

29. A method as claimed in claim 21, wherein a distance between the top surface of the permanent magnet in said magnetic field generating mechanism and said substrate is in a range of from 100 mm to 1,000 mm.

30. A method as claimed in claim 21, wherein said bias power source is a DC power source.

31. A method as claimed in claim 21, wherein said bias power source is a AC power source.

\* \* \* \* \*